(12) United States Patent
Hsieh

(10) Patent No.: US 10,181,487 B2
(45) Date of Patent: Jan. 15, 2019

(54) HIGH RELIABILITY HOUSING FOR A SEMICONDUCTOR PACKAGE

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/679,373

(22) Filed: Aug. 17, 2017

(65) Prior Publication Data
US 2017/0345859 A1 Nov. 30, 2017

Related U.S. Application Data

(62) Division of application No. 15/175,226, filed on Jun. 7, 2016.

(60) Provisional application No. 62/302,227, filed on Mar. 2, 2016.

(51) Int. Cl.
*H01L 27/146* (2006.01)
*H01L 25/16* (2006.01)
*H01L 23/00* (2006.01)

(52) U.S. Cl.
CPC ...... *H01L 27/14618* (2013.01); *H01L 25/167* (2013.01); *H01L 27/1469* (2013.01); *H01L 27/14625* (2013.01); *H01L 27/14634* (2013.01); *H01L 27/14636* (2013.01); *H01L 27/14643* (2013.01); *H01L 27/14678* (2013.01); *H01L 27/14685* (2013.01); *H01L 24/29* (2013.01); *H01L 24/32* (2013.01); *H01L 24/48* (2013.01); *H01L 24/73* (2013.01); *H01L 2224/2919* (2013.01); *H01L 2224/32225* (2013.01); *H01L 2224/48227* (2013.01); *H01L 2224/73265* (2013.01); *H01L 2224/83385* (2013.01); *H01L 2924/00014* (2013.01); *H01L 2924/15174* (2013.01); *H01L 2924/15311* (2013.01); *H01L 2924/16151* (2013.01); *H01L 2924/16152* (2013.01); *H01L 2924/16235* (2013.01); *H01L 2924/181* (2013.01)

(58) Field of Classification Search
None
See application file for complete search history.

(56) References Cited

U.S. PATENT DOCUMENTS

| 7,576,401 | B1 | 8/2009 | de Guzman et al. |
| 2003/0042587 | A1* | 3/2003 | Lee ............ H01L 23/66 257/678 |
| 2003/0201535 | A1* | 10/2003 | Chen ........... H01L 23/055 257/738 |

(Continued)

OTHER PUBLICATIONS

"MIT Introduction and Structure," Xintec, Mar. 20, 2013.

*Primary Examiner* — Khaja Ahmad
(74) *Attorney, Agent, or Firm* — IPTechLaw

(57) ABSTRACT

Implementations of semiconductor packages may include: a substrate coupled to one or more die and to one or more connectors, a glass lid coupled over one or more die by an adhesive and a housing comprising one or more sides and a bottom opening and a top opening. The substrate may be coupled to the housing at the bottom opening and the glass lid may be coupled under the housing at the top opening.

18 Claims, 4 Drawing Sheets

(56) References Cited

U.S. PATENT DOCUMENTS

| | | | |
|---|---|---|---|
| 2003/0222333 A1* | 12/2003 | Bolken | H01L 23/293 257/678 |
| 2008/0157250 A1* | 7/2008 | Yang | H01L 27/14618 257/433 |
| 2008/0211045 A1* | 9/2008 | Ono | H01L 27/14618 257/432 |
| 2009/0085138 A1* | 4/2009 | Ryu | H01L 25/50 257/434 |
| 2015/0137148 A1* | 5/2015 | Wong | H01L 25/167 257/82 |

* cited by examiner

HIGH RELIABILITY HOUSING FOR A SEMICONDUCTOR PACKAGE

CROSS REFERENCE TO RELATED APPLICATIONS

This document claims the benefit of the filing date of U.S. Provisional Patent Application 62/302,227, entitled "High Reliability Housing for a Semiconductor Package" to Yu-Te Hsieh which was filed on Mar. 2, 2016, the disclosure of which is hereby incorporated entirely herein by reference.

This application is also a divisional application of the earlier U.S. Utility patent application to Yu-Te Hsieh entitled "High Reliability Housing for a Semiconductor Package," application Ser. No. 15/175,226, filed Jun. 7, 2016, now pending, the disclosure of which is hereby incorporated entirely herein by reference.

BACKGROUND

1. Technical Field

Aspects of this document relate generally to semiconductor packages with dies having sensing areas. More specific implementations involve chip on board packages with image sensors.

2. Background Art

Conventionally, to seal a semiconductor package, liquid encapsulation (LE) or molding is used. The LE covers and protects the connectors from mechanical damage and protects the area where the glass lid and die are coupled together from moisture.

SUMMARY

Implementations of semiconductor packages may include: a substrate coupled to one or more die and to one or more connectors, a glass lid coupled over one or more die by an adhesive and a housing comprising one or more sides and a bottom opening and a top opening. The substrate may be coupled to the housing at the bottom opening and the glass lid may be coupled under the housing at the top opening.

Implementations of semiconductor packages may include one, all, or any of the following:

The substrate may be a ball grid array substrate.

The one or more die may be stacked on each other.

A mold compound may encapsulate at least a portion of one of the one or more die or at least one of the one or more connectors.

The housing may be made of an opaque material.

The housing may be formed through injection molding, transfer molding or any combination thereof.

A plurality of ball mounts may be coupled to a second side of the substrate opposing a side of the substrate coupled to the die.

The one or more lenses may be coupled to the housing in an optical path of the glass lid.

Implementations of semiconductor packages may be manufactured using implementations of a method of making a semiconductor package. The method may include providing a substrate and coupling one or more die to the substrate. The method may also include electrically coupling the die to the substrate using one or more connectors. The method may also include coupling a glass lid to the one or more die using an adhesive. The method may also include simultaneously coupling a housing to the substrate at a bottom opening of the housing and over a glass lid at a top opening of the housing using an adhesive.

Implementations of a method of making a semiconductor package may include one, all or any of the following:

The substrate may be a ball grid array substrate.

The housing may be made of an opaque material.

The housing may be formed through injection molding, transfer molding or any combination thereof.

A plurality of ball mounts may be coupled to a second side of the substrate opposing a side of the substrate coupled to the die.

One or more lenses may be coupled to the housing in an optical path of the glass lid.

Semiconductor package implementations disclosed herein may be manufactured using another implementation of a method of manufacturing a semiconductor package. The method may include providing a substrate, coupling one or more die to the substrate and electrically coupling the die to the substrate using one or more connectors. The method may also include encapsulating one or more connectors and at least a portion of one of the one or more die using a mold compound. The method may also include coupling an additional die to one of the one or more die. The method may also include electrically coupling the additional die to the substrate with one or more connectors. The method may also include coupling a glass lid to the additional die using an adhesive. The method may also include simultaneously coupling a housing to the substrate at a bottom opening of the housing and over the glass lid at a top of the housing using an adhesive.

Implementations of a method of making a semiconductor package may include one, all or any of the following:

The substrate may be a ball grid array substrate.

The housing may be made of an opaque material.

The housing may be formed through one of injection molding, transfer molding or any combination thereof.

A plurality of ball mounts may be coupled to a second side of the substrate opposing a side of the substrate coupled to the die.

One or more lenses may be coupled to the housing in an optical path of the glass lid.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor housing packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor housing packages, and implementing components and methods, consistent with the intended operation and methods.

Figure 1:
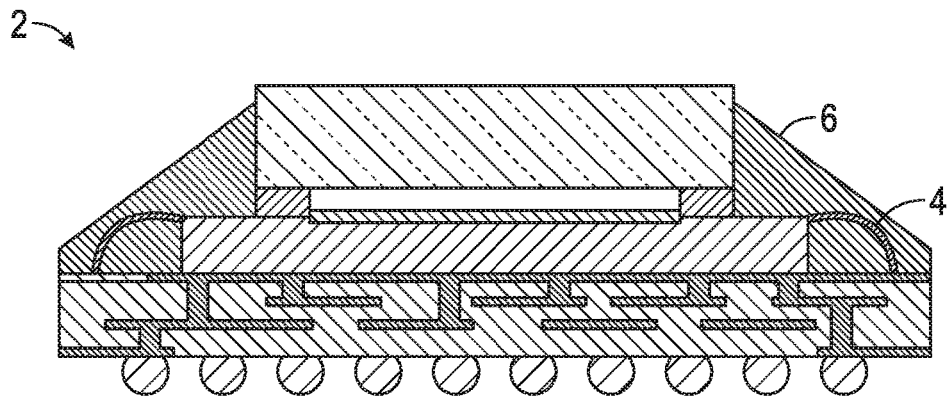
FIG. 1 is a break apart view of a conventional complementary metal-oxide semiconductor (CMOS) image sensor (CIS) ball grid array packaging.

FIG. 1 illustrates a conventional semiconductor package 2 with wire bonding 4 and liquid encapsulation 6. The liquid encapsulation 6 covers and protects the wire bonding 4 area from mechanical damage. A major drawback of the conventional packaging is a mismatch that exists between the coefficient of thermal expansion (CTE) of the liquid encapsulation resin and the substrate. The CTE mismatch can cause thermal stress during temperature cycling tests and decreases the reliability of the package.

Figure 2:
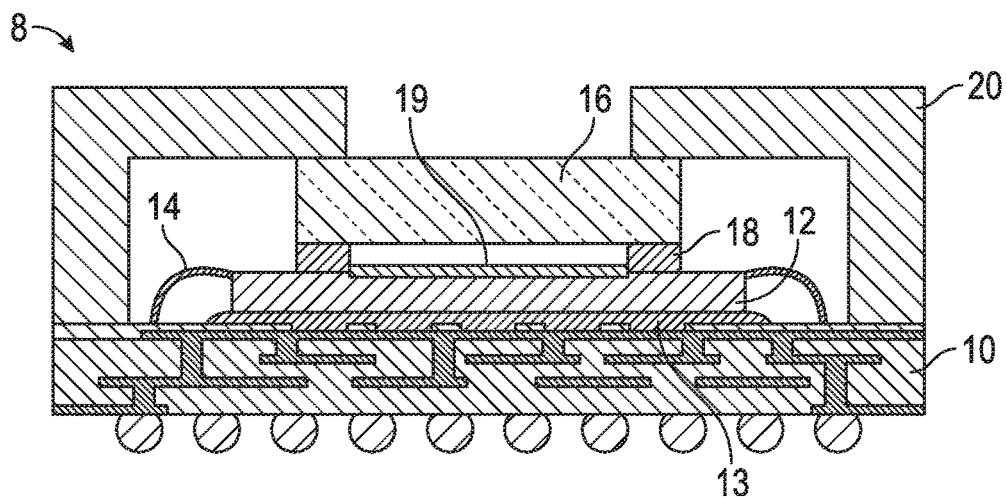
FIG. 2 is a side view of an implementation a semiconductor package with a housing.

Referring to FIG. 2, an implementation of a semiconductor package 8 with housing 20 is illustrated. Here, the substrate 10 is coupled to a die 12 by an adhesive 13 and to one or more connectors 14. The connectors 14 may include a wire made out of any electrically conductive material (wirebonds, etc.). The glass lid 16 is coupled to the die 12 by an adhesive 18. The glass lid is positioned over the sensing area 19 of the die 12 and the adhesive 18 is coupled to the die 12 on/at the non-sensing area. The housing 20 has one or more sides and a bottom opening and a top opening. The bottom opening of the housing 20 is mechanically coupled to the substrate 10. The glass lid 16 is coupled under the housing 20 at the top opening. One feature of the housing 20 on the semiconductor packaging 8 over the liquid encapsulation (FIG. 1) is that the housing 20 does not touch the connectors 14. Contact between the housing and the connectors 14 could lead to wire fatigue with wire connectors. Another feature is there is no coefficient of thermal energy mismatch between a liquid encapsulation compound and the die, as there is nothing but air or gas (or vacuum in various implementations) between the housing and the die, which limits any damage to the connectors during temperature cycling.

Figure 3:
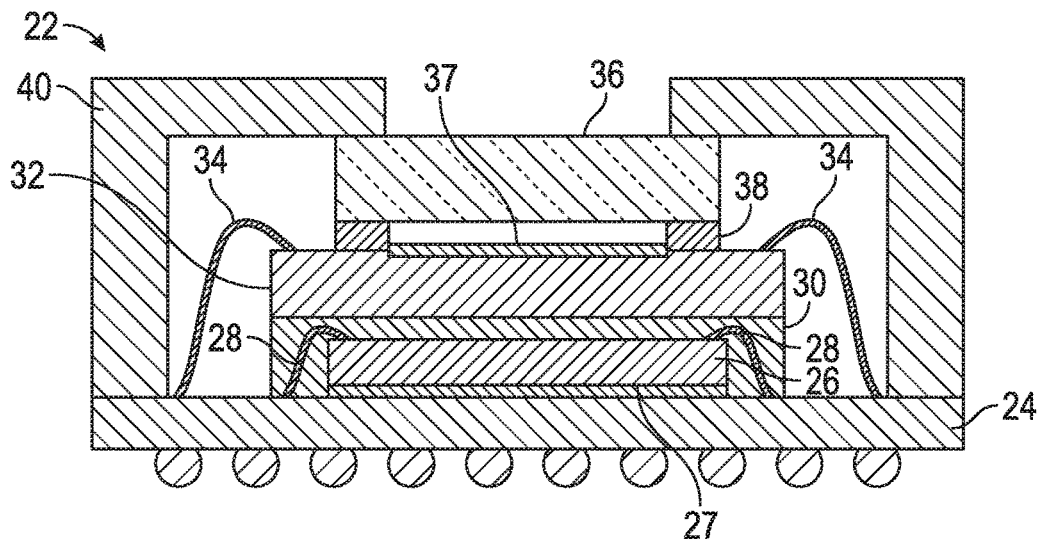
FIG. 3 is a side view of another implementation a semiconductor package with a housing.

Referring to FIG. 3, another implementation of a semiconductor package housing 22 is illustrated. A substrate 24 is coupled to a die 26 (first die) by an adhesive 27 and to one or more connectors 28. By non-limiting example the die 26 may be an in-system programming (ISP) die. A mold compound/liquid encapsulant 30 encapsulates the die 26 and connectors 28. The mold 30 is made flat around the die 26 and connectors 28 to enable the coupling of an additional die 32 (second die) to the semiconductor package 22. The additional die 32 is electrically coupled to the substrate 24 through one or more connectors 34. By non-limiting example, the additional die 32 may be a contact image sensor (CIS) die. The additional die 32 may also be coupled directly to the surface of the die 26 by an adhesive. A glass lid 36 is coupled to the additional die 32 using an adhesive 38. The glass lid 36 is positioned over the sensing area 37 of the additional die 32 and the adhesive 38 is coupled to/at the non-sensing area of the additional die 32. A housing 40 is coupled to the substrate 24 at the bottom opening of the housing 40 and over the glass lid 36 at a top opening of the housing 40 using an adhesive.

Figure 4:
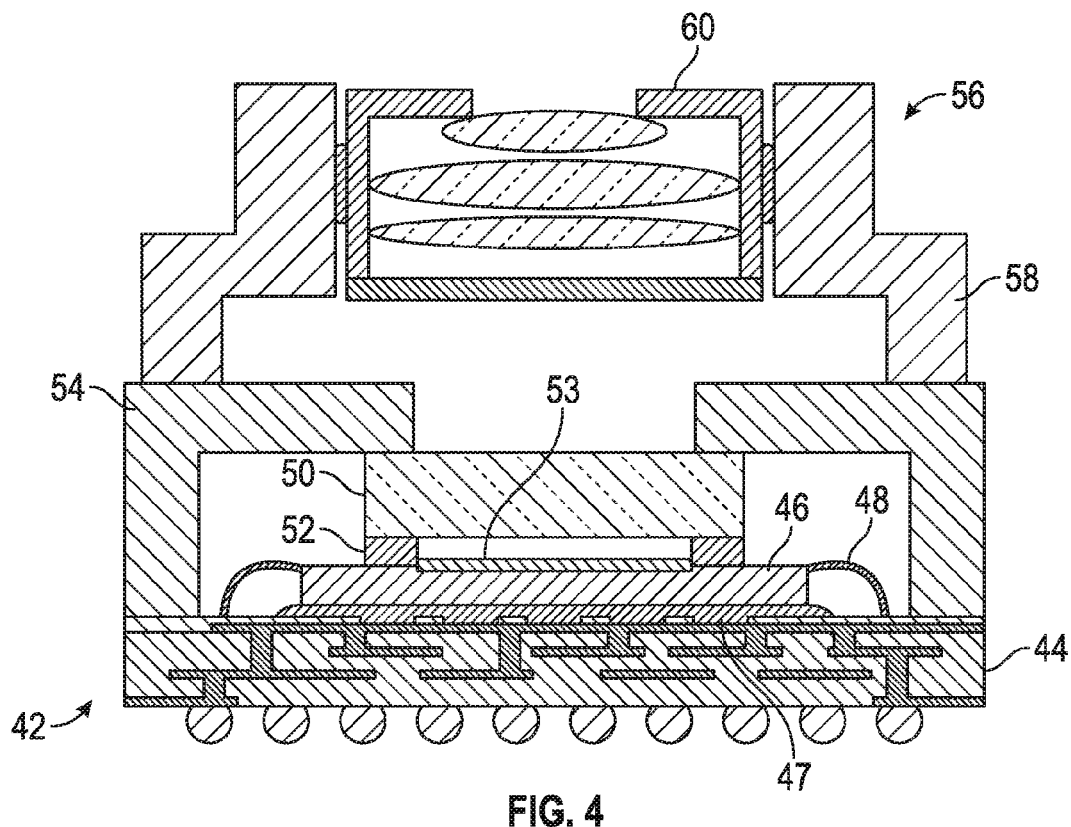
FIG. 4 is a side view of another implementation a semiconductor package with a housing having an optics package attachment.

Referring to FIG. 4, another implementation of a semiconductor package 42 with housing 54 having an optics package/unit/assembly 56 attached is illustrated. The substrate 44 is coupled to the die 46 by an adhesive 47 and connectors 48. The glass lid 50 is coupled to the die 46 by an adhesive 52. The glass lid 50 is positioned over the sensing area 53 of the die 46 and the adhesive 52 is coupled to the non-sensing area 53 of the die 46. The substrate 44 is coupled to the housing 54 at the bottom opening. The glass lid 50 is coupled under the housing 54 at the top opening. The flat structure of the housing 54 allows the coupling of a housing of the optics package 56 to the semiconductor package 42. An optics package 56, having a lens housing 58 and one or more lenses 60, may be coupled to the semiconductor package 42 housing 54 in an optical path of the glass lid 50. While in the implementation illustrated, the one or more lenses 60 are located in the optical path directly above the sensing area 53 of the die 46, in other implementations, they may not be directly above the sensing area 53, but may be positioned in other locations, but still in the optical path through the use of other mirrors, lenses, and the like.

Figure 5A:
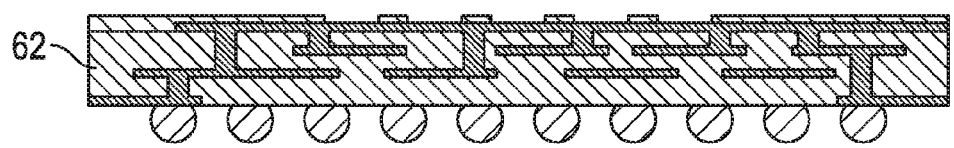
FIG. 5A-5D shows a package implementation at various steps of an implementation of a method for making a semiconductor package with a housing.
Figure 5B:
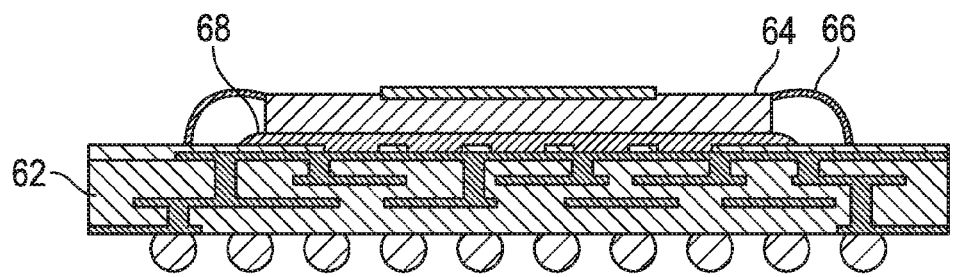
Figure 5C:
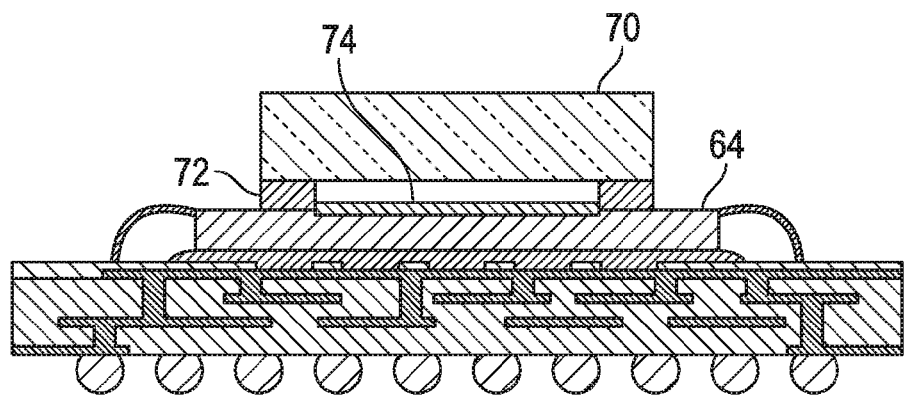
Figure 5D:
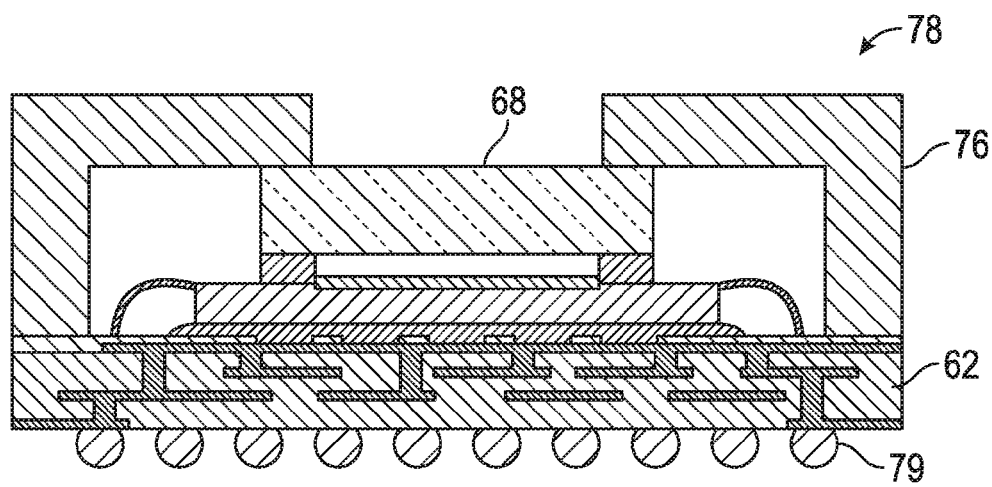

Referring to FIG. 5A-5D, an implementation of a method of manufacturing a semiconductor package like those disclosed in this document is illustrated. FIG. 5A illustrates a substrate 62. By non-limiting example, the substrate 62 may be a multilevel substrate with traces through the levels that connect to the ball grid array, though single level substrates may be used in other implementations, which do not include ball grid arrays (like land grid array substrates). FIG. 5B illustrates coupling one or more die 64 to the substrate 62 and electrically coupling the die to the substrate 62 by an adhesive 68 and one or more connectors 66. FIG. 5C illustrates coupling a glass lid 70 to the die 64 using an adhesive 72. The glass lid 70 is coupled over the sensing area 74 of the die 64. The adhesive 72 is coupled to the non-sensing area of the die 64. By non-limiting example, the sensing area 74 of the die 64 may be a pixel array or the active area of a light emitting diode (LED). In such LED implementations, the sensing area becomes an active area that actively emits light. FIG. 5D illustrates coupling the housing 76 to the semiconductor package 78. In this process, the housing 76 is simultaneously coupled to the substrate 62 at the bottom opening of the housing 76 and over the glass lid 68 at a top opening of the housing 76 using an adhesive. The housing 76 may be made of an opaque material in various implementations, but could also be made of a translucent or transparent material in other implementations. The housing 76 may be formed through one of injection molding, transfer molding and any combination thereof. A ball grid array 79 may be coupled to the opposing side of the substrate 62 where the housing 76 is coupled to the substrate 62 in various implementations.

Figure 6A:
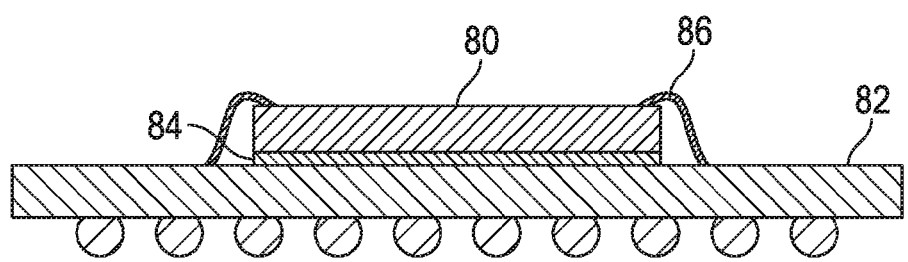
FIG. 6A-6D shows a package implementation at various steps another implementation of a method for making a semiconductor package with a housing.
Figure 6B:
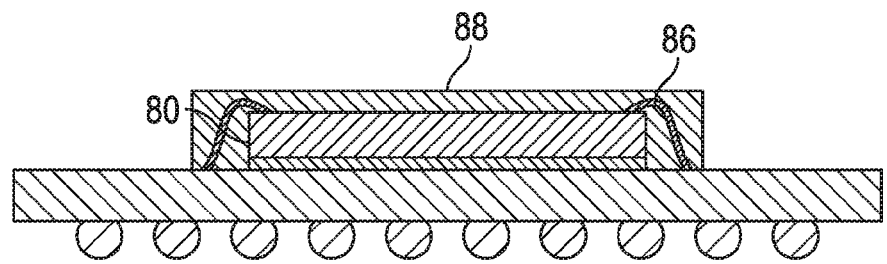
Figure 6C:
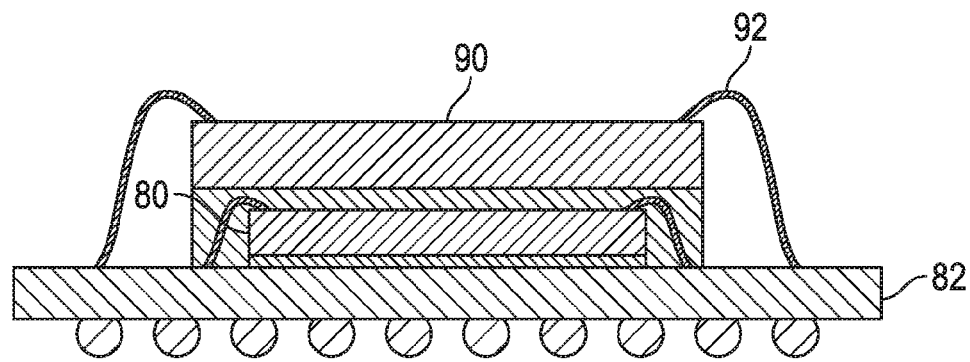

Referring to FIG. 6A-6D, another implementation of a method for manufacturing a semiconductor package like those disclosed herein is illustrated. FIG. 6A illustrates mechanically and electrically coupling a die 80 to a substrate 82 with an adhesive 84 and connectors 86. FIG. 6B illustrates encapsulating the connectors 86 and at least a portion of the die 80 with a mold compound 88. By non-limiting example, the molding may be added by a transfer molding process using a thermal setting (thermoset) polymer material to minimize CTE mismatch. Such polymer materials may also have desirably physical and mechanical properties that may help achieve good reliability performance for the package. FIG. 6C illustrates coupling an additional die 90 to one of the one or more die 80 and electrically coupling the additional die 90 to the substrate 82 with one or more connectors 92.

Figure 6D:
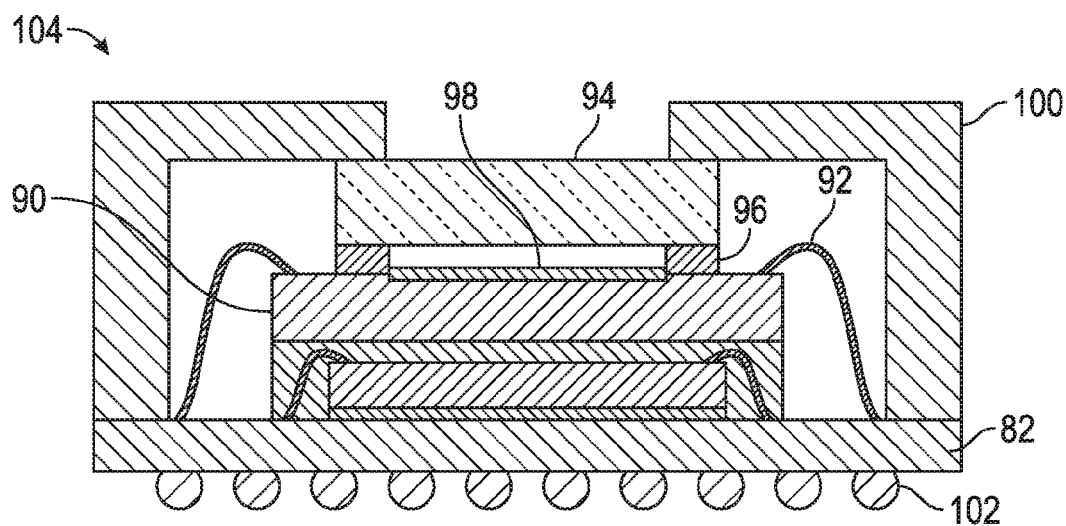

FIG. 6D illustrates coupling a glass lid 94 to the additional die 90 using an adhesive 96. The glass lid 94 is positioned over the sensing area 98 of the additional die 90. The adhesive 96 is coupled to the non-sensing area of the additional die 90. Then the housing 100 is simultaneously coupled to the substrate 82 at a bottom opening of the housing 100 and over the glass lid 94 at a top opening of the housing 100 using an adhesive. The housing 100 does not touch the connectors 92. A ball grid array 102 may be coupled to the substrate 82. In this implementation, the additional die 90 may be an LED or an image sensor like any disclosed in this document.

In places where the description above refers to particular implementations of semiconductor packages with housing and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method of making a semiconductor package, the method comprising:
    providing a substrate;
    coupling one or more die to the substrate;
    electrically coupling the one or more die to the substrate using one or more connectors;
    encapsulating one of the one or more connectors and at least a portion of one of the one or more die using a mold compound;
    coupling an additional die to one of the one or more die after encapsulating at least a portion of the one of the one or more die;
    electrically coupling the additional die to the substrate with one or more connectors;
    coupling a glass lid to the additional die using an adhesive; and
    simultaneously coupling a housing to the substrate at a bottom opening of the housing and over the glass lid at a top opening of the housing using an adhesive.

2. The method of claim 1, wherein the substrate is a ball grid array substrate.

3. The method of claim 1, wherein the housing is made of an opaque material.

4. The method of claim 1, wherein the housing is formed through one of injection molding, transfer molding and any combination thereof.

5. The method of claim 1, wherein a plurality of ball mounts is coupled to a second side of the substrate opposing a side of the substrate coupled to the die.

6. The method of claim 1, further comprising coupling one or more lenses to the housing in an optical path of the glass lid.

7. A method of making a semiconductor package, the method comprising:
    providing a substrate;
    coupling a first die to the substrate;
    electrically coupling the first die to the substrate using one or more connectors;
    encapsulating one of the one or more connectors and at least a portion of the first die using a mold compound;
    coupling a second die to the first die after encapsulating at least a portion of the first die;
    electrically coupling the second die to the substrate with one or more connectors;
    coupling a glass lid to the second die using an adhesive; and
    simultaneously coupling a housing to the substrate at a bottom opening of the housing and over the glass lid at a top opening of the housing using an adhesive.

8. The method of claim 7, wherein the substrate is a ball grid array substrate.

9. The method of claim 7, wherein the housing is made of an opaque material.

10. The method of claim 7, wherein the housing is formed through one of injection molding, transfer molding and any combination thereof.

11. The method of claim 7, wherein a plurality of ball mounts is coupled to a second side of the substrate opposing a side of the substrate coupled to the die.

12. The method of claim 7, further comprising coupling one or more lenses to the housing in an optical path of the glass lid.

13. A method of making a semiconductor package, the method comprising:
    providing a substrate;
    coupling a first die to the substrate;
    electrically coupling the first die to the substrate using one or more connectors;
    encapsulating one of the one or more connectors and at least a portion of the first die using a mold compound;
    coupling a second die over the first die after encapsulating at least a portion of the first die;
    electrically coupling the second die to the substrate with one or more connectors;
    coupling a glass lid to the second die using an adhesive; and
    simultaneously coupling a housing to the substrate at a bottom opening of the housing and over the glass lid at a top opening of the housing using an adhesive.

14. The method of claim 13, wherein the substrate is a ball grid array substrate.

15. The method of claim 13, wherein the housing is made of an opaque material.

16. The method of claim 13, wherein the housing is formed through one of injection molding, transfer molding and any combination thereof.

17. The method of claim 13, wherein a plurality of ball mounts is coupled to a second side of the substrate opposing a side of the substrate coupled to the die.

18. The method of claim 13, further comprising coupling one or more lenses to the housing in an optical path of the glass lid.

* * * * *